US006624476B1

(12) United States Patent
Chan et al.

(10) Patent No.: US 6,624,476 B1
(45) Date of Patent: Sep. 23, 2003

(54) SEMICONDUCTOR-ON-INSULATOR (SOI) SUBSTRATE HAVING SELECTIVE DOPANT IMPLANT IN INSULATOR LAYER AND METHOD OF FABRICATING

(75) Inventors: Simon Siu-Sing Chan, Saratoga, CA (US); Matthew S. Buynoski, Palo Alto, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/134,973

(22) Filed: Apr. 29, 2002

Related U.S. Application Data

(60) Provisional application No. 60/287,130, filed on Apr. 27, 2001.

(51) Int. Cl.[7] .................................... H01L 29/00

(52) U.S. Cl. .................... 257/347; 257/348; 257/349; 257/350; 257/351; 257/352; 257/353; 257/354

(58) Field of Search ............................ 257/219–222, 257/347–354

(56) References Cited

U.S. PATENT DOCUMENTS

| | | | |
|---|---|---|---|
| 5,567,638 | A | 10/1996 | Lin et al. |
| 5,629,221 | A | 5/1997 | Chao et al. |
| 5,885,877 | A | 3/1999 | Gardner et al. |
| 6,043,138 | A | 3/2000 | Ibok |
| 6,420,759 | B2 * | 7/2002 | Yamazaki et al. |

* cited by examiner

*Primary Examiner*—Fetsum Abraham

(74) *Attorney, Agent, or Firm*—Renner, Otto, Boisselle & Sklar, LLP

(57) ABSTRACT

A semiconductor-on-insulator (SOI) device includes a buried insulator layer and an overlying semiconductor layer. Portions of the insulator layer are doped with the same dopant material, for example boron, as is in corresponding portions of the overlying surface semiconductor layer. A peak concentration of the dopant material may be located in the insulator material, or may be located in a lower portion of the surface semiconductor layer. The dopant material in the insulator layer may prevent depletion of dopant material from portions of the surface semiconductor layer, such as from channel portions of NMOS transistors.

33 Claims, 2 Drawing Sheets

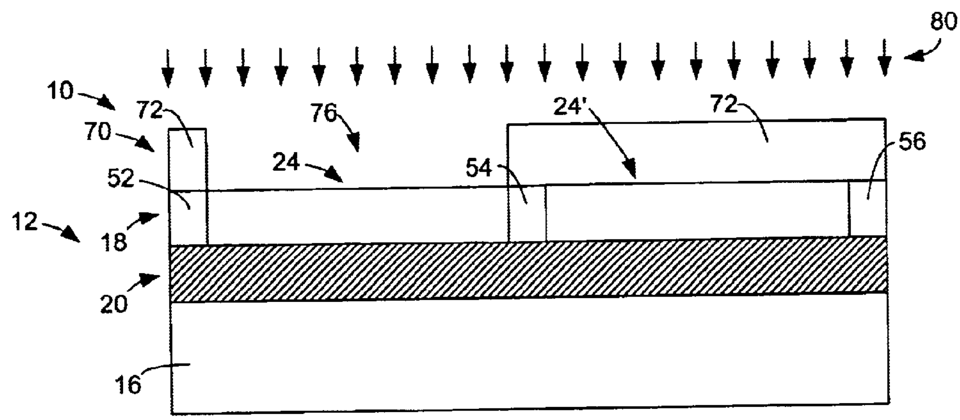
Fig. 4
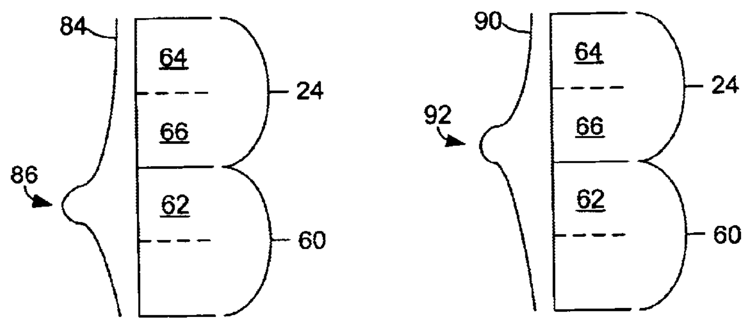
Fig. 5
Fig. 6
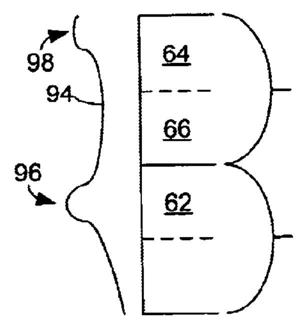
Fig. 7

SEMICONDUCTOR-ON-INSULATOR (SOI) SUBSTRATE HAVING SELECTIVE DOPANT IMPLANT IN INSULATOR LAYER AND METHOD OF FABRICATING

This application claims the benefit of U.S. Provisional Application No. 60/287,130, filed Apr. 27, 2001, which is hereby incorporated by reference.

BACKGROUND OF THE INVENTION

1. Field of Invention

The present invention relates to the manufacture of semiconductor devices, and in particular to methods of preventing dopant depletion in active regions of such devices built on semiconductor-on-insulator (SOI) substrates.

2. Description of the Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the channel being doped oppositely to the drain and source. The gate electrode is separated from the semiconductor substrate by a thin insulating layer (i.e., a gate dielectric layer) such as an oxide. The operation of the IGFET involves application of an input voltage to the gate electrode, which sets up a transverse electric field in the channel in order to modulate the longitudinal conductance of the channel.

In typical IGFET fabrication processes, the source and drain are formed by introducing dopants of a second conductivity type (P or N) into the semiconductor substrate of a first conductivity type (N or P) using a mask. Other steps of IGFET fabrication processes, such as annealing, involve elevated temperatures.

For IGFETs built on SOI substrates, dopant migration into the buried oxide tends to occur during high temperature processing. This dopant migration occurs at higher rates for dopant materials with low atomic weights, such as boron. As active surface semiconductor regions get increasingly thin, as in a fully-depleted SOI devices, the dopant migration can lead to undesirable front channel doping changes, as well as undesirable lowering of the threshold voltage of the unwanted back channel region.

SUMMARY OF THE INVENTION

A semiconductor-on-insulator (SOI) device includes a buried insulator layer and an overyling semiconductor layer. Portions of the insulator layer are doped with the same dopant material, for example boron, as is in corresponding portions of the overlying surface semiconductor layer. A peak concentration of the dopant material may be located in the insulator material, or may be located in a lower portion of the surface semiconductor layer. The dopant material in the insulator layer may prevent depletion of dopant material from portions of the surface semiconductor layer, such as from channel portions of NMOS transistors.

According to an aspect of the invention, a semiconductor-on-insulator (SOI) device includes a surface semiconductor layer and a buried insulator layer beneath the surface semiconductor layer. A portion the surface semiconductor layer and a portion of the insulator layer are both doped with a dopant material, and wherein the portion of the semiconductor layer and the portion of the insulator layer are in contact with each other.

According to another aspect of the invention, a semiconductor-on-insulator (SOI) device includes a surface semiconductor layer having a surface channel region which includes a dopant material; and means for reducing loss at elevated temperatures of the dopant material from the surface channel region.

According to yet another aspect of the invention, a method of preventing migration of a dopant material from a channel region of a surface semiconductor layer of a semiconductor-on-insulator (SOI) device, includes the steps of: implanting the dopant material in a buried doped portion of the SOI device; and forming the channel region above the doped portion.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings:

FIGS. 2–4 are side cross-sectional schematic views illustrating some of the steps of a method of fabricating the device of FIG. 1; and FIGS. 5–7 illustrate possible dopant material concentration distributions for the device of FIG. 1.

DETAILED DESCRIPTION

A semiconductor-on-insulator (SOI) device includes a buried insulator layer, portions of which are doped with a dopant material, such as boron, which is also used to dope corresponding portions of an overlying semiconductor layer. The introduction of the dopant material into the portions of the insulator layer and the semiconductor layer may be performed by a single implant, or by multiple implants. The implant(s) may include one or more masked implants. Peak concentration(s) of the dopant material may be located in the insulator material, and/or may be located in the surface semiconductor layer, such as in a lower portion of the surface semiconductor layer. The dopant material in the insulator layer may prevent depletion of dopant material from portions of the surface semiconductor layer, such as from channel portions of NMOS transistors.

Figure 1:
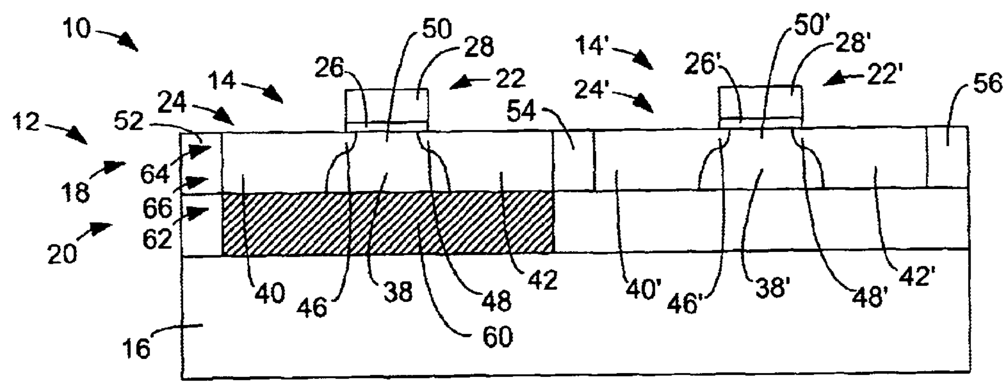
FIG. 1 is a side cross-sectional schematic view of an SOI device formed in accordance with the present invention.

Referring initially to FIG. 1, a semiconductor device 10 includes an SOI wafer 12 with an NMOS transistor 14 and a PMOS transistor 14' formed thereupon. The SOI wafer 12 includes a semiconductor substrate 16 and a surface semiconductor layer 18, with a buried insulator layer 20 therebetween. As is conventional, the semiconductor substrate 16 and the surface semiconductor layer 18 may be made of silicon and the buried insulator layer 20 may include a silicon oxide such as $SiO_2$, although it will be appreciated that other suitable materials may be used instead or in addition. Further, as described in greater detail below, the buried insulator layer 20 may have portions that include a dopant material, such as boron.

The NMOS transistor 14 includes a gate 22 formed on an active semiconductor region 24 of the surface semiconductor layer 18. The active semiconductor region may have a thickness of between 100 and 2000 Å (Angstroms). The gate 22 includes a gate dielectric 26 and a gate electrode 28. Exemplary materials for the gate dielectric 26 are $SiO_2$ and $Si_3N_4$. The gate electrode 28 may be made of polysilicon or another semiconductor, or may be made in whole or in part of metal.

The active region 24 includes a body 38, with a source 40 and a drain 42 on respective opposite sides of the body. The source 40 and the drain 42 have respective source and drain extensions 46 and 48. The body includes a channel 50 between the source 40 and the drain 42 along the underside of the gate dielectric 26. The body 38 is of P-conductivity semiconductor material while the source 40 and the drain 42 are N-conductivity semiconductor material. Typical dopant materials for achieving N-type conductivity include P, As, and Sb. Typical dopant materials for achieving P-type conductivity include Al, Ga, B, $BF_2$, and In. Some of the dopants may be placed in the active layer 24 when the layer or semiconductor material is formed. Alternatively or in addition, the dopants for one or more of the regions may be added in a later processing step, such as in one or more implanting operations.

The source 40, the drain 42, and the channel 50, are operatively coupled with the gate 22 to function as a transistor. The source 40 and the drain 42 are covered by a metal silicide (also referred to as "silicide regions"), to minimize series resistance. The gate electrode 28 likewise may includes an upper conductive portion to facilitate electrical connection.

The active region 24 is laterally isolated from other structures of the device 10 by insulator-filled trenches 52 and 54 on opposite sides of the active region. The insulator-filled trenches 52 and 54 may be trenches filled with silicon dioxide ($SiO_2$), produced using known shallow trench isolation (STI) techniques. It will be appreciated that other suitable isolation structures and/or techniques may be used alternatively or in addition.

The PMOS transistor 14' may have similar structures, indicated by primed reference numerals, to those of the NMOS transistor 14 described above. The body 38' of the PMOS transistor 14' is of N-conductivity semiconductor material while the source 40' and the drain 42' are of P-conductivity semiconductor material. The active region 24' of the PMOS transistor 14' is laterally isolated from other structures by insulator-filled trenches 54 and 56 on opposite sides of the active region 24'.

As mentioned above, the insulator layer 20 includes a doped portion 60 underlying at least part of the active region 24 of the NMOS transistor 14. The doped portion 60 includes a dopant material, such as the same dopant material used in at least one of the body 38, the source 40, and the drain 42. The dopant material may include a low atomic weight element, such as boron. Examples of such a dopant material include boron and boron fluoride ($BF_2$). The dopant material may have a concentration of between $10^{17}$ and $10^{21}$ atoms/$cm^2$.

The dopant material in the doped portion 60 may advantageously reduce the tendency of dopant material to migrate from the overlying active region 24 to the insulator layer, such as during manufacturing operations involving heating. The presence of the dopant material in the doped portion 60 may reduce or prevent the loss of dopant material from the back side of the body 38 (where the body intersects the insulator layer 20); may allow a retrograde channel doping profile to be achieved (lower concentration of doping material in the channel 50 than in the body 38 as a whole); and/or may counteract changes to the doping of the front channel 50 which would otherwise occur as a result of doping migration.

The dopant material may be substantially uniformly distributed throughout the doped portion. Alternatively, the concentration of dopant material may be higher in some parts of the insulator layer 20 than in other parts of the insulator layer. For example, the concentration of dopant material may be greater in an upper layer 62 of the doped portion 60, nearer the active region 24 of the NMOS transistor 14, than in areas of the doped portion 60 farther from the active region. As described in further detail below, the dopant material concentration may have one or more local peaks in the doped portion 60 of the insulator layer 20 and/or in the active region 24 of the NMOS transistor 14. For example, there may be a local concentration peak in an upper half 64 of the active region 24, such as in the channel 50. Alternatively or in addition, there may be a concentration peak in a lower half 66 of the active region 24.

The semiconductor device 10 shown in FIG. 1 and described above is but one example of semiconductor devices that may be produced with selectively doped buried insulator layers. It will be appreciated that many variants are possible. For example, the device may include a wide variety of NMOS and PMOS transistors in any of various configurations. Other semiconductor elements may be present. There may be doped portions of the insulator layer underlying some or all of the PMOS transistors, either instead of or in addition to the doped portions underlying some or all of the NMOS transistors. Doped portions underlying the PMOS transistors may be doped with a different dopant material than the doped portions underlying the NMOS transistors. Alternatively, the doped insulator layer portions corresponding to the PMOS transistors may be doped with the same dopant material as the doped insulator layer portions underlying the NMOS transistors, for example functioning to reduce the tendency of dopant material to migrate to the insulator layer from the source and drain regions of the PMOS transistors.

Figure 2:
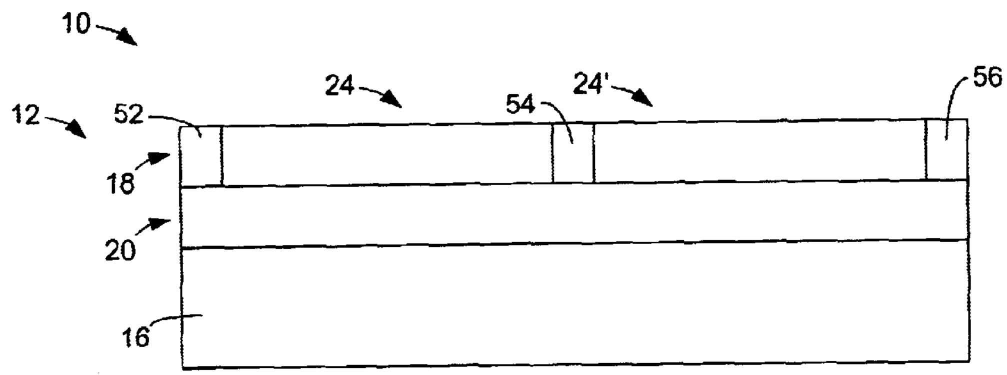
Figure 3:
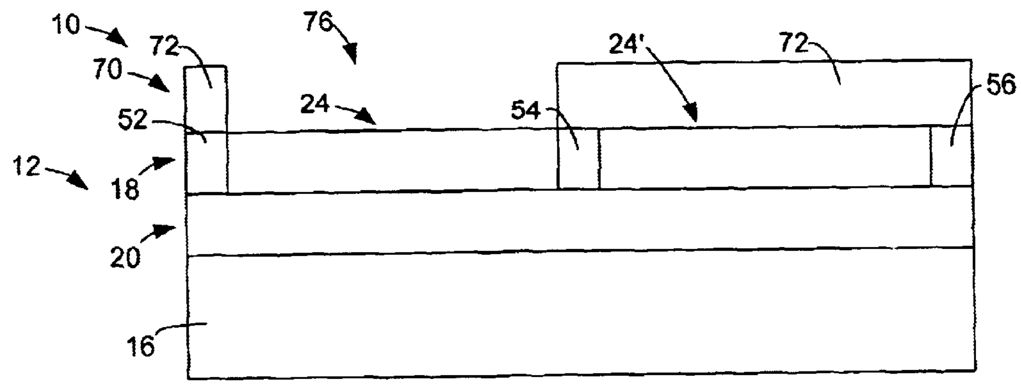

FIGS. 2–4 illustrate various steps involved in making the semiconductor device 10 shown in FIG. 1 and described above. Referring to FIG. 2, starting initially with the SOI wafer 12, the insulator-filled trenches 52-56 are created. It will be appreciated that there are many well-known sources and methods for producing SOI wafers such as the SOI wafer 12. The surface semiconductor layer 18 may be lightly doped by a dopant material, such as boron. The dopant included in the lightly-doped surface semiconductor layer 18 may be a P-type material or an N-type material.

The insulator-filled trenches 52–56 define and laterally isolated the active regions 24 and 24' of the surface semiconductor layer 18. The insulator-filled trenches 52–56 may be formed using conventional well-known shallow trench isolation (STI) or local oxidation (LOCOS) techniques.

It will be appreciated that the trenching may be performed at another point in the process, either earlier or later, if desired.

Then, as illustrated in FIG. 3, an implant mask 70 is formed. The implant mask is used for controlling the location of the doped sections of the surface semiconductor layer 18 and/or of the buried insulator layer 20. For example, the mask 70 may cover the active region 24' upon which the PMOS transistor 14' is to be formed. The mask 70 may formed by deposition of a resist such as photoresist, followed by selective exposure and etching of the resist to produce the mask of mask elements 72 with mask openings 76 therebetween.

Turning now to FIG. 4, one or more implants of the dopant material, such as an implant 80, are used to doped the doped portion 60 of the insulator layer 20. The implant(s) may also dope the active region 24, or a portion thereof which is exposed through the mask openings 76.

The dopant material may be any of the dopant materials disclosed earlier, for example boron. The energy of the dopant ions may be from about 2 to about 200 keV. As noted above, there may be multiple doping implants, with a low-energy shallow implant designed to implant the dopant material primarily in the active region 24, and a higher-energy deep implant designed to implant the dopant material primarily in the doped portion 60 of the insulator layer 20. The higher-energy implant may be performed so as to implant the dopant material substantially fully within the insulator layer 20, with or without use of a low-energy implant. Alternatively, it will be appreciated that the deep implant may have an energy selected such that the dopant material is located primarily in the lower part of the active region 24. It will be appreciated that the depth of the implant for a given dopant material will be a function of the implant energy. The energy for the low-energy shallow implant may be from about 2 to about 20 keV, and the energy for the higher-energy deep implant may be from about 10 to about 200 keV.

FIGS. 5–7 illustrate some possible dopant material concentrations in the active region 24 and in the doped portion 60, following the dopant implant(s) described above. FIG. 5 illustrates a concentration distribution 84 which has a concentration peak 86 which is within the doped portion 60. As is shown in FIG. 5, the concentration peak 86 may be within the upper half 62 of the doped portion 60, the half nearest to the active region 24. Alternatively, the concentration peak 86 may be elsewhere in the doped portion 60.

FIG. 6 shows a dopant material concentration distribution 90 with a peak 92 in the active region 24. FIG. 7 illustrates a more complicated dual-peak distribution 94, with a deep peak 96 in the doped portion 60, and a secondary shallow peak 98 at or near the top surface of the active region 24. The secondary shallow peak 98 may for example be in the channel region 50, within the upper half 64 of the active region 24. As shown, the deep peak 96 may have a higher concentration than that of the secondary shallow peak 98. It will be appreciated that the deep peak 96 may alternatively be in the lower half 66 of the active region 24.

The overall peaks of the distributions 84, 90, and 94 shown in FIGS. 5–7 may be from about $5\times10^{17}$ to about $10^{21}$, although it will be appreciated that other values are possible.

Following the implant(s) of FIG. 4, structures may be formed on the active region 24, for example to create the NMOS transistor 14. The structures may include well-known fabrication processes such as deposition, masking, etching, implanting, and annealing. Some of the fabrication processes may be performed prior to the removal of the mask 70. It will be appreciated that fabrication processes may also be performed for fabricating the PMOS transistor 14'.

It will be appreciated that parts of the above-described methods may be employed to fabricate SOI wafers with doped buried insulator layers. Such wafers may be used to produce a variety of semiconductor devices.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor-on-insulator (SOI) device comprising:

a surface semiconductor layer; and a buried insulator layer beneath the surface semiconductor layer;

wherein a portion of the surface semiconductor layer and a portion of the insulator layer are both doped with a dopant material, and wherein the portion of the semiconductor layer and the portion of the insulator layer are in contact with each other;

wherein the doped portion of the surface semiconductor layer includes a surface channel region of the surface semiconductor layer; and wherein a peak concentration of the dopant material is in the insulator layer.

2. The device of claim 1, wherein the portion of the insulator layer completely underlies the portion of the surface semiconductor layer.

3. The device of claim 1, wherein the dopant material includes boron.

4. The device of claim 1, wherein the portion of the surface semiconductor layer includes a body region having the surface channel region, and wherein the surface semiconductor layer also includes a source region and a drain region in contact with and on opposite sides of the body region.

5. The device of claim 4, wherein the portion of the insulator layer completely underlies the body region.

6. The device of claim 5, wherein the portion of the insulator layer also completely underlies the source region and the drain region.

7. The device of claim 4, wherein the channel region, the source region, and the drain region are operatively coupled to a gate formed on the surface semiconductor layer.

8. The device of claim 1, wherein the surface semiconductor layer has a thickness between 100 and 2000 Å (Angstroms).

9. The device of claim 1, wherein the surface semiconductor material includes silicon and the insulator layer includes $SiO_2$.

10. The device of claim 1, wherein the insulator layer includes one or more undoped portions.

11. The device of claim 1, wherein the dopant material has a secondary peak concentration in the surface semiconductor layer.

12. The device of claim 11, wherein the secondary peak concentration is in an upper half of the surface of the semiconductor layer.

13. A semiconductor-on-insulator (SOI) device comprising:

a surface semiconductor layer; and a buried insulator layer beneath the surface semiconductor layer;

wherein a portion of the surface semiconductor layer and a portion of the insulator layer are both doped with a dopant material, and wherein the portion of the semiconductor layer and the portion of the insulator layer are in contact with each other; and wherein a peak concentration of the dopant material is in the surface semiconductor layer.

14. The device of claim 13, wherein the peak concentration is a lower half of the surface semiconductor layer, which is adjacent to the insulator layer.

15. The device of claim 13, wherein the portion of the insulator layer completely underlies the portion of the surface semiconductor layer.

16. The device of claim 13, wherein the dopant material includes boron.

17. The device of claim 13, wherein the portion of the surface semiconductor layer includes a body region having a surface channel region, and wherein the surface semiconductor layer also includes a source region and a drain region in contact with and on opposite sides of the body region.

18. The device of claim 17, wherein the portion of the insulator layer completely underlies the body region.

19. The device of claim 18, wherein the portion of the insulator layer also completely underlies the source region and the drain region.

20. The device of claim 17, wherein the channel region, the source region, and the drain region are operatively coupled to a gate formed on the surface semiconductor layer.

21. The device of claim 13, wherein the surface semiconductor layer has a thickness between 100 and 2000 Å (Angstroms).

22. The device of claim 13, wherein the surface semiconductor material includes silicon and the insulator layer includes $SiO_2$.

23. The device of claim 13, wherein the insulator layer includes one or more undoped portions.

24. The device of claim 13, wherein the doped portion of the surface semiconductor layer includes a surface channel region that is operatively coupled to an overlying gate.

25. The device of claim 24, wherein the peak concentration is a lower half of the surface semiconductor layer, adjacent to the insulator layer and underlying the surface channel region.

26. The device of claim 13, wherein a secondary peak concentration of the dopant material is in the insulator layer.

27. A semiconductor-on-insulator (SOI) device comprising:

a surface semiconductor layer; and a buried insulator layer beneath the surface semiconductor layer;

wherein a portion of the surface semiconductor layer and a portion of the insulator layer are both doped with a dopant material, and wherein the portion of the semiconductor layer and the portion of the insulator layer are in contact with each other; and wherein the portion of the insulator layer has a higher concentration of the dopant material than the portion of the surface semiconductor layer.

28. The device of claim 27, wherein the doped portion of the surface semiconductor layer includes a surface channel region that is operatively coupled to an overlying gate.

29. A semiconductor-on-insulator (SOI) device comprising:

a surface semiconductor layer; and a buried insulator layer beneath the surface semiconductor layer;

wherein a portion of the surface semiconductor layer and a portion of the insulator layer are both doped with a dopant material, and wherein the portion of the semiconductor layer and the portion of the insulator layer are in contact with each other; and wherein the insulator layer has a concentration of the dopant material of between $10^{17}$ and $10^{21}$ atoms/cm$^2$.

30. A semiconductor-on-insulator (SOI) device comprising:

a surface semiconductor layer having a surface channel region which includes a dopant material; and means for reducing loss at elevated temperatures of the dopant material from the surface channel region;

wherein the means for reducing loss includes a buried insulation region of the surface semiconductor layer which underlies the channel region having a concentration of the dopant material which is greater than that of the surface channel region.

31. The device of claim 30, wherein the dopant material is boron.

32. The device of claim 30, wherein the means for reducing loss includes an insulator layer underlying the surface semiconductor layer, wherein a portion of the insulator layer under the channel region includes the dopant material.

33. The device of claim 30, wherein the means for reducing loss includes means for providing additional dopant material to the surface channel region, to thereby at least reduce net loss of the dopant material from the surface channel region due to migration of the dopant material from the surface channel region.

* * * * *